United States Patent [19]

Miyauchi et al.

[11] Patent Number: 4,815,089
[45] Date of Patent: Mar. 21, 1989

[54] SEMICONDUCTOR LASER

[75] Inventors: Nobuyuki Miyauchi; Shigeki Maei, both of Tenri; Osamu Yamamoto, Nara; Taiji Morimoto, Nara; Hiroshi Hayashi, Soraku; Saburo Yamamoto, Uda, all of Japan

[73] Assignee: Sharp Kabushiki Kaisha, Osaka, Japan

[21] Appl. No.: 732,284

[22] Filed: May 9, 1985

[30] Foreign Application Priority Data

May 16, 1984 [JP] Japan .................. 59-99318

[51] Int. Cl.$^4$ .............................. H01S 3/19
[52] U.S. Cl. ...................... 372/49; 372/45; 372/46
[58] Field of Search .................. 372/44–50

[56] References Cited

U.S. PATENT DOCUMENTS

| | | | |
|---|---|---|---|
| 3,838,359 | 9/1974 | Hakki et al. | 372/49 |
| 4,317,086 | 2/1982 | Scifres et al. | 372/49 |
| 4,546,481 | 10/1985 | Yamamoto et al. | 372/46 |

OTHER PUBLICATIONS

Ladany et al., "Al$_2$O$_3$ half-wave films for long-life CW lasers", Applied Physics Letters, vol. 30, No. 2, Jan. 15, 1977, pp. 87–88.

Streifer et al., "Reduction of GaAs Diode Laser Spontaneous Emission," Applied Physics Letters, vol. 37, No. 1, Jul. 1, 1980, pp. 10–12.

Ettenberg, "A New Dielectric Facet Reflector for Semiconductor Lasers," Applied Physics Letters, vol. 32, No. 11, Jun. 1978, pp. 724–725.

Patents Abstracts of Japan, vol. 8, No. 84—Apr. 18, 1984 Fujitsu K. K.

Patents Abstracts of Japan, vol. 9, No. 216—Sep. 3, 1985.

*Primary Examiner*—William L. Sikes
*Assistant Examiner*—Georgia Y. Epps
*Attorney, Agent, or Firm*—Birch, Stewart, Kolasch & Birch

[57] ABSTRACT

A semiconductor laser includes a front mirror facet and a rear mirror facet. An Al$_2$O$_3$ film coating is formed on the front mirror facet by electron beam evaporation so that the front mirror facet has a reflectance between 10 and 20%. A multi-layered coating is formed on the rear mirror facet so that the rear mirror facet has a reflectance higher than 90%.

6 Claims, 4 Drawing Sheets

SEMICONDUCTOR LASER

BACKGROUND OF THE INVENTION

1. Field of the Invention

The present invention relates to a semiconductor laser structure which ensures stable operation at a high power output operation.

2. Description of the Prior Art

A short wave semiconductor laser made of crystals such as GaAs or GaAlAs is under development for practical use in medium range optical communication systems optical video disc systems, optical measuring systems, and the like. Especially, the semiconductor laser is effective as the light source in an optical video disc system when the semiconductor laser stably operates at a high power output level.

A novel semiconductor laser was proposed by Sasaki et al, in TGOQE82-125, pp. 51, 1982, wherein the front mirror facet is constructed to have a low reflectance, and the rear mirror facet is constructed to have a high reflectance. The kink power level is enhanced due to the increase of the external differential quantum efficiency, whereby the semiconductor laser develops a laser beam at an output level higher than 30 mW. In this article, it was proposed to form an insulating coating on the front mirror facet with a $SiO_2$ film having a thickness of $\lambda/4$ ($\lambda$:oscillating wavelength) through the use of the sputtering technique or the evaporation technique. A multi-film coating is formed on the rear mirror facet through the use of the sputtering method. A typical example is the four-layered coating consisting of alternating films of $\lambda/4$ $SiO_2$ and amorphous silicon. The front mirror facet has a reflectance of 6%, and the rear mirror facet has a reflectance of 90%. The kink power level can be doubled as compared to the conventional semiconductor laser which has a $SiO_2$ coating film on both mirror facets. The current-optical output characteristics show a linear relation even above 30 mW output.

However, the combination of the reflectance of 6% at the front facet and 90% at the rear facet can not ensure a stable operation when the threshold current increases. The beam waist position is not stable and the output level varies depending on the return beam. The threshold current $I_{th}$ is expressed as follows when the reflectance of the front mirror facet is $R_f$ and the reflectance of the rear mirror face is $R_r$.

$$I_{th} = \frac{dLw}{\eta_{sp}} \left[ J_0 + \frac{1}{\beta} \left( \alpha_i + \frac{1}{2L} \ln \frac{1}{R_f R_r} \right) \right]$$

Where, L is the cavity length, w is the stripe width of the current path, $\eta_{sp}$ is the internal quantum efficiency, $J_0$ and $\beta$ are constants, $\Gamma$ is the confinement factor, and $\alpha_i$ is the internal loss.

FIG. 1 shows the variation of the threshold current $I_{th}$ when $R_f$ is varied while $R_r$ is held constant (0.9). The threshold current $I_{th}$ is standardized when a dielectric film having the thickness of $\lambda/2$ is coated on the front mirror facet to make the front reflectance $R_f=0.32$. It will be clear from FIG. 1 that the threshold current $I_{th}$ increases as the front reflectance $R_f$ decreases. The increase of the threshold current $I_{th}$ functions to reduce the reliability of the semiconductor laser. The operating life period of the semiconductor laser is reduced when the high temerature accelerated life test is conducted. Increase of the threshold current is not preferable especially in the semiconductor laser which emits a laser beam having a wavelength shorter than 780 nm. On the other hand, if the front reflectance is increased to reduce the threshold current $I_{th}$, the internal optical density is increased and, therefore, a high power operation cannot be conducted.

The semiconductor laser inevitably exhibits astigmatism. Astigmatism is caused by the apparent difference of the beam waist position between the horizontal transverse mode and the vertical transverse mode. The vertical transverse mode has a beam waist exactly at the mirror facet because of the perfect index guide structure. However, the horizontal transverse mode has a beam waist position within the cavity at a distance from the mirror facet of at least 2 to 3 $\mu$m, or about 10 $\mu$m in a semiconductor laser having an inner stripe structure such as the CSP laser or the VSIS laser. The astigmatism precludes a clear image formation in the optical system including a convex lens. Further, the beam waist position of the horizontal transverse mode varies depending on the current density. When the current density is low, namely, when the semiconductor laser operates at a low output power level, the beam waist position is located in the cavity at a distance from the mirror facet of 3 to 10 $\mu$m. When the current density is high, namely, when the semiconductor laser operates at a high power output level, for example 30 mW, the beam waist position shifts close to the mirror facet due to the self-focusing effect of the laser beam. When the front reflectance is small, for example, 6%, and when the output level is small, for example, 3 mW, the current density increases only slightly past the threshold current because the differential quantum efficiency is high. The beam waist position is located within the cavity and is distanced from the mirror facet by several microns. FIG. 2 shows the beam waist position which varies depending on the laser output level in a semiconductor laser which has a low front reflectance, for example, several percent.

In the optical video disc system, the optical pickup device includes a semiconductor laser and an optical system having a convex lens. The read-out operation is normally conducted with a low power laser, for example, 3 mW output. On the other hand, the write-in operation is conducted with a high power laser, for example, 30 mW output. The conventional semiconductor laser having a low front reflectance is not effective in such a system because the beam waist position varies between the read-out operation and the write-in operation.

Another problem is caused by the return beam. The return beam cannot be eliminated so long as the semiconductor laser is employed in an optical system of the image-formation type. The return beam produces return beam noise, with the laser emission thus becoming unstable. FIG. 3 shows the S/N ratio which varies depending on the return beam. It will be clear from FIG. 3 that the return beam noise increases as the return beam increases. The low front reflectance, 6%, allows a high transmission of the return beam into the semiconductor laser.

OBJECTS AND SUMMARY OF THE INVENTION

Objects of the Invention

Accordingly, an object of the present invention is to provide a semiconductor laser which ensures a stable operation in a wide output range.

Another object of the present invention is to properly select the front reflectance and the rear reflectance in a semiconductor laser.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, the front mirror facet is coated with dielectric oxide film such as $Al_2O_3$ or $SiO_2$ having a thickness of about $\lambda/3$. The front reflectance is about 10 to 20%. The rear mirror facet is coated with at least a four layered film including a dielectric oxide film such as $Al_2O_3$ film or $SiO_2$ film having a thickness of about $\lambda/4$ and an amorphous silicon film. The rear reflectance is above 90%.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
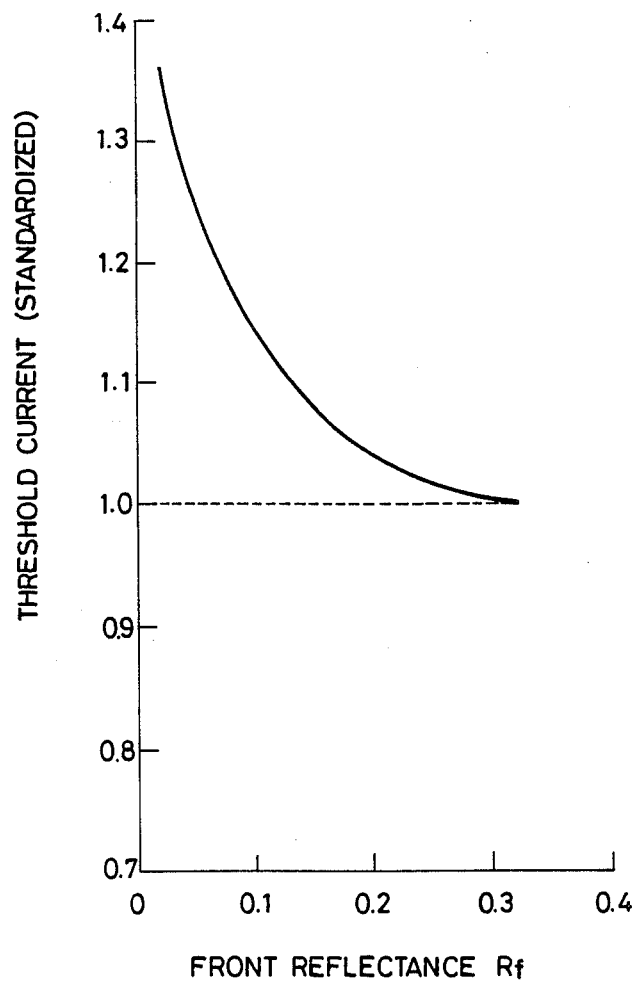
FIG. 1 is a graph showing the threshold current which varies depending on the front reflectance in a semiconductor laser.
Figure 2:
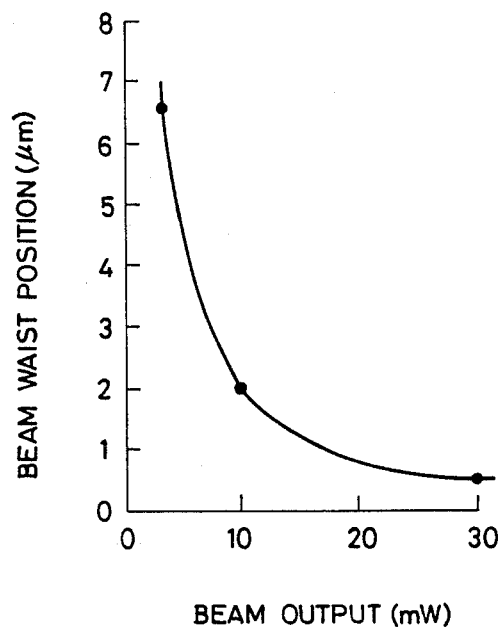
FIG. 2 is a graph showing the beam waist position which varies depending on the laser output level.
Figure 4:
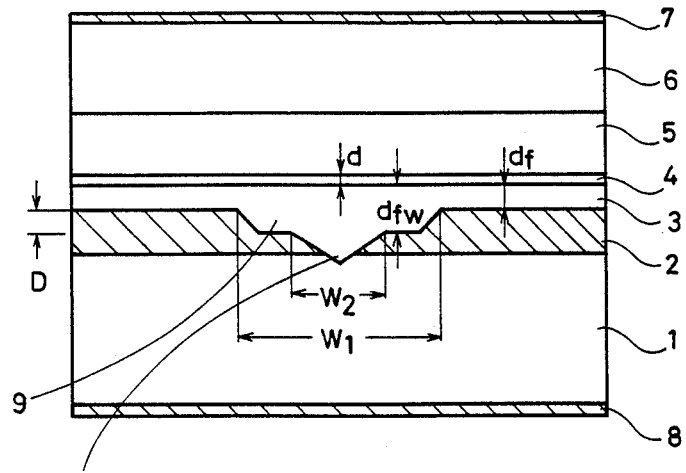
FIG. 4 is a sectional view of an embodiment of a BSIS laser of the present invention.

FIG. 4 shows an embodiment of the present invention, a BSIS (Broad-channeled Substrate Inner Stripe) laser of the GaAs-GaAlAs semiconductor type. An n-GaAs current blocking layer 2 having a thickness of 0.8 $\mu$m is formed on the (100) surface of a p-GaAs substrate 1 through the use of the liquid phase epitaxial growth method. A rectangular groove 9 having a width $w_1$ of 6.5 $\mu$m, and a depth D of 0.2 $\mu$m is formed in the n-GaAs current blocking layer 2 through the use of the photolithography technique and the chemical etching technique. Then, a V-shaped groove 10 is formed along the center of the rectangular groove 9 by the etching technique. The V-shaped groove 10 has a width $w_2$ of 3.5 $\mu$m, and a depth sufficient to reach the p-GaAs substrate 1. The V-shaped groove 10 functions as the current path. A p-$Ga_{0.5}Al_{0.5}As$ cladding layer 3 is formed on the n-GaAs current blocking layer 2 in a manner that the p-$Ga_{0.5}Al_{0.5}As$ cladding layer 3 is filled in the channel groove (9 and 10). The top surface of the p-$Ga_{0.5}Al_{0.5}As$ cladding layer 3 is flat. A p-$Ga_{0.85}Al_{0.15}As$ active layer 4, an n-$Ga_{0.5}Al_{0.5}As$ cladding layer 5, and an n-GaAs cap layer 6 are sequentially formed on the p-$Ga_{0.5}Al_{0.5}As$ cladding layer 3 by the liquid phase epitaxial growth method, thereby forming the double-hetero structure. A thickness $d_f$ of the p-$Ga_{0.5}Al_{0.5}As$ cladding layer 3 is 0.1 $\mu$m where the channel groove is not formed, and a thickness $d_{fw}$ is 0.3 $\mu$m where the rectangular groove 9 is formed. A thickness d of the p-$Ga_{0.85}Al_{0.15}As$ active layer 4 is 0.06 $\mu$m. The n-$Ga_{0.5}Al_{0.5}As$ cladding layer 5 has a thickness of 0.3 to 1.0 $\mu$m, and the n-GaAs cap layer 6 has a thickness of 0.5 to 3.0 $\mu$m. The rear surface of the GaAs substrate 1 is wrapped to make the substrate thickness about 100 $\mu$m. An n-electrode (Au-Ge-Ni) 7 is formed on the n-GaAs cap layer 6, and a p-electrode (Au-Zn) 8 is formed on the rear surface of the p-GaAs substrate 1 through the use of the evaporation technique. The electrodes are alloyed by a heating treatment under a temperature of 450° C. The electrodes 7 and 8 are connected to a drive source, and function, in combination, as the carrier injection electrodes.

Figure 5:
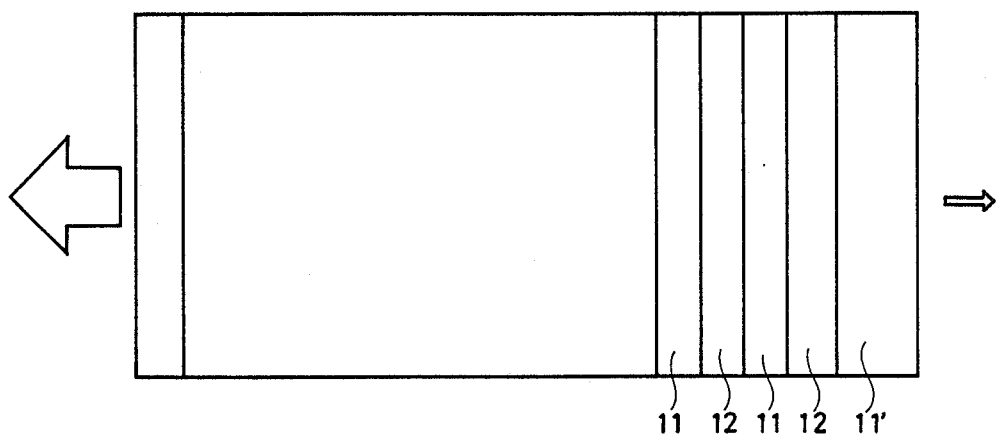
FIG. 5 is a schematic view for explaining protective coatings included in the BSIS laser of FIG. 4.

The thus formed semiconductor laser wafer is cleaved to form a Fabry-Perot cavity having a cavity length of 250 $\mu$m at the active layer 4. An $Al_2O_3$ film 11 is formed on the front facet by the electron beam evaporation method. The $Al_2O_3$ film preferably has a thickness of about $\lambda/3$ ($\lambda$:oscillating wavelength). On the rear facet, a multi-coating including a $\lambda/4$ $Al_2O_3$ film 11, a $\lambda/4$ amorphous silicon film 12, another $\lambda/4$ $Al_2O_3$ film 11 and another $\lambda/4$ amorphous slicon film 12 (see FIG. 5) is formed by the electron beam evaporation method. Further, an $Al_2O_3$ protective film 11' having a thickness of about $\lambda/2$ is formed on the outer-most amorphous silicon film 12. The front reflectance is 17%, and the rear reflectance is 95%.

Figure 6:
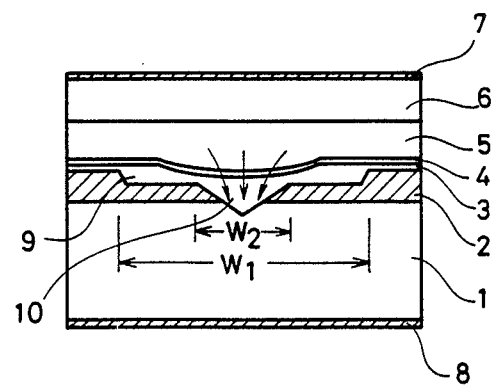
FIG. 6 is a sectional view of another embodiment of a BSIS laser of the present invention.

FIG. 6 shows another embodiment of the semiconductor laser of the present invention. Like elements corresponding to those of FIG. 4 are indicated by like numerals. The semiconductor laser of FIG. 6 includes a crescent active layer 4, which is formed when the p-cladding layer 3 has a surface following the grooves 9 and 10. The crescent active layer 4 ensures a stable operation in the fundamental transverse mode. The front reflectance is selected between 10 and 20%, and preferably between 15 to 20%, and the rear reflectance is selected above 90%.

Figure 3:
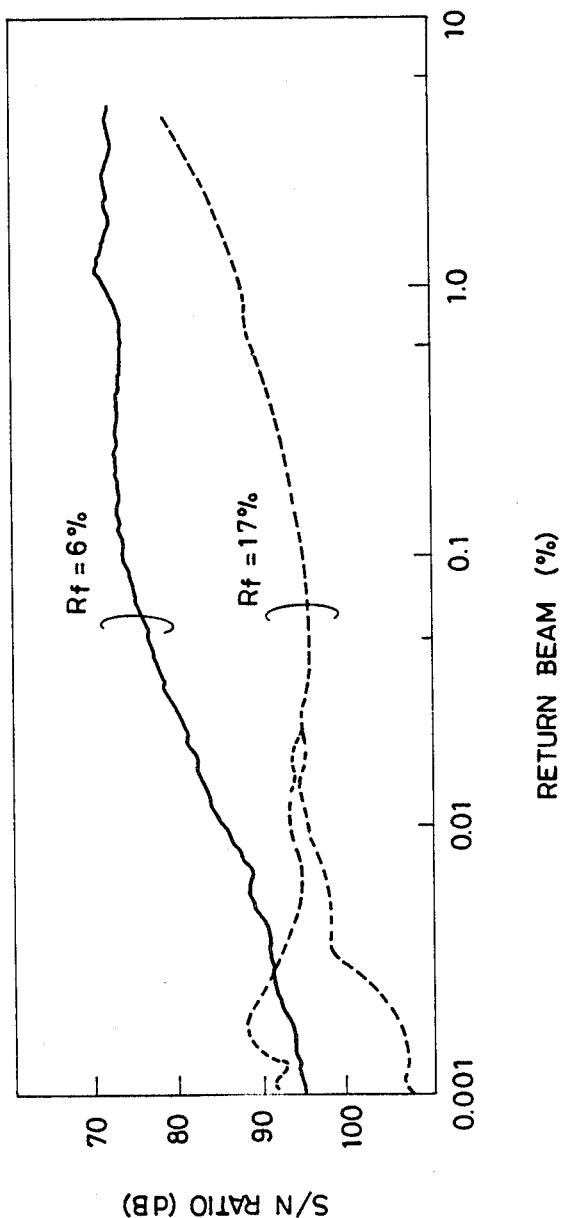
FIG. 3 is a graph showing the return beam noise which varies depending on the return beam introduced into a semiconductor laser.

When the current is injected from the n-electrode 7 and the p-electrode 8, the current flows from the substrate through the two-stage channel groove. The spatial hole burning effect of the carrier distribution is limited in the active layer 4 so that the laser emission is carried out in the zero-order mode. The fundamental transverse mode laser emission of the linear characteristics is observed when the laser wavelength is 780 nm, the threshold current is less than 45 mA, and the output power is less than 50 mW. A stable operation is ensured even after the 1000-hour high temperature accelerated life test which is carried out at a temperature of 50° C. and the output power of 30 mW. The beam waist position is located exactly at the mirror facet for the horizontal and vertical transverse modes when the output power is less than 50 mW. The return beam noise is minimized as shown by the broken line in FIG. 3.

The present invention is applicable not only to semiconductor lasers of the GaAs-GaAlAs type, but also to other types of semiconductor laser such as the InP-InGaAsP type.

The invention being thus described, it will be obvious that the same may be varied in many ways without departure from the spirit and scope of the invention, which is limited only by the following claims.

What is claimed is:

1. In a semiconductor laser including a semiconductor substrate, an active layer sandwiched by a pair of cladding layers disposed on said substrate, and front and rear facets the improvement comprising:
    a first coating formed on said front facet such that said front facet exhibits a reflectivity in the range of 10 to 20%; and
    a second coating formed on said rear facet such that said rear facet exhibits a reflectivity of greater than 90%,
    said first and second coatings enabling said laser to be operable over a wide range of output power levels.

2. In a semiconductor laser as claimed in claim 1, further comprising a current blocking layer disposed between said semiconductor substrate and one of said pair of cladding layers, wherein an inner stripe is formed in said current blocking layer to form a current path.

3. In a semiconductor laser as claimed in claim 2, wherein said coating formed on said front facet comprises an $Al_2O_3$ film.

4. A semiconductor laser operable over a wide range of output power levels, comprising:
    a semiconductor substrate;
    a current blocking layer disposed on said substrate;
    an active layer sandwiched by a pair of cladding layers disposed on said current blocking layer;
    a cap layer disposed on an upper cladding layer;
    a first electrode disposed on said cap layer;
    a second electrode disposed on said substrate on a surface opposite to said current blocking layer;
    a front facet;
    a rear facet;
    a first coating formed on said front face such that said front facet exhibits a reflectivity in the range of 10 to 20%; and
    a second coating formed on said rear facet such that said rear facet exhibits a reflectivity of greater than 90%;
    said reflectivity of said front facet ensuring a constant beam waist position of said laser over a wide range of output power levels.

5. The semiconductor laser of claim 4, wherein an inner stripe is formed in said current blocking layer to form a current path.

6. The semiconductor laser of claim 4, wherein said first coating comprises an $Al_2O_3$ film.

* * * * *